(12) United States Patent
Li et al.

(10) Patent No.: US 11,164,998 B2
(45) Date of Patent: Nov. 2, 2021

(54) ELECTRODE STRUCTURE, MICRO LIGHT EMITTING DEVICE, AND DISPLAY PANEL

(71) Applicant: PlayNitride Display Co., Ltd., MiaoLi County (TW)

(72) Inventors: Yu-Chu Li, MiaoLi County (TW); Pei-Hsin Chen, MiaoLi County (TW); Yi-Chun Shih, MiaoLi County (TW); Yi-Ching Chen, MiaoLi County (TW)

(73) Assignee: PlayNitride Display Co., Ltd., MiaoLi County (TW)

( * ) Notice: Subject to any disclaimer, the term of this patent is extended or adjusted under 35 U.S.C. 154(b) by 77 days.

(21) Appl. No.: 16/689,102

(22) Filed: Nov. 20, 2019

(65) Prior Publication Data

US 2021/0135054 A1 May 6, 2021

(30) Foreign Application Priority Data

Oct. 31, 2019 (TW) .................................. 108139427

(51) Int. Cl.
*H01L 33/38* (2010.01)
*H01L 33/62* (2010.01)
*H01L 25/075* (2006.01)

(52) U.S. Cl.
CPC .......... *H01L 33/38* (2013.01); *H01L 25/0753* (2013.01); *H01L 33/62* (2013.01)

(58) Field of Classification Search
None
See application file for complete search history.

(56) References Cited

U.S. PATENT DOCUMENTS

| 2019/0019929 | A1* | 1/2019 | Lim | ................... H01L 33/502 |
| 2021/0050285 | A1* | 2/2021 | Takao | ................... H01L 23/12 |

FOREIGN PATENT DOCUMENTS

| CN | 108155141 | 6/2018 |
| GN | 103456729 | 12/2013 |
| GN | 109216516 | 1/2019 |
| GN | 109411584 | 3/2019 |
| JP | 2002033511 | 1/2002 |
| TW | 201810736 | 3/2018 |
| TW | 201928642 | 7/2019 |

\* cited by examiner

*Primary Examiner* — Nicholas J Tobergte
*Assistant Examiner* — Kien C Ly
(74) *Attorney, Agent, or Firm* — JCIPRNET (57) ABSTRACT

An electrode structure includes a first electrode and a second electrode disposed opposite to each other. The first electrode has a first side and a second side. The second side is located between the first side and the second electrode. The first electrode has a maximum vertical length and a minimum vertical length from the first side to the second side, and a ratio of the minimum vertical length to the maximum vertical length is less than 0.8. The second electrode and the first electrode are separated by a first vertical gap and a second vertical gap, and the second vertical gap is greater than the first vertical gap.

14 Claims, 5 Drawing Sheets

ELECTRODE STRUCTURE, MICRO LIGHT EMITTING DEVICE, AND DISPLAY PANEL

CROSS-REFERENCE TO RELATED APPLICATION

This application claims the priority benefit of Taiwan application serial no. 108139427, filed on Oct. 31, 2019. The entirety of the above-mentioned patent application is hereby incorporated by reference herein and made a part of this specification.

BACKGROUND

Technical Field

The disclosure relates to an electrode structure, a micro light emitting device, and a display panel, and in particular relates to an electrode structure for preventing a short circuit, a micro light emitting device using the electrode structure, and a display panel using the electrode structure and the micro light emitting device.

Description of Related Art

A micro LED (micro light emitting diode) display has advantages such as low power consumption, high brightness, high color saturation, fast response time, and power saving, and what is more, a micro LED display has good material stability and is free of image sticking. Therefore, the development of the display technology for micro LED displays has drawn a lot of attention.

In terms of the manufacturing process, in the process of transferring a micro LED from a growth substrate to a driving circuit substrate, it is required to heat and pressurize the micro LED so as to electrically bond the micro LED to the driving circuit substrate. However, in this transfer bonding process, the electrode of the micro LED and the pad on the driving circuit substrate may short-circuit due to misalignment, which impairs the reliability of the micro LED display.

SUMMARY

The disclosure provides an electrode structure for preventing a short circuit caused by misconnection.

The disclosure also provides a micro light emitting device that uses the electrode structure to provide a buffering effect during a bonding process.

The disclosure further provides a display panel that uses the electrode structure and the micro light emitting device to achieve favorable reliability.

An electrode structure of the disclosure includes a first electrode and a second electrode disposed opposite to each other. The first electrode has a first side and a second side. The second side is located between the first side and the second electrode. The first electrode has a maximum vertical length and a minimum vertical length from the first side to the second side, and a ratio of the minimum vertical length to the maximum vertical length is less than 0.8. The second electrode and the first electrode are separated by a first vertical gap and a second vertical gap, and the second vertical gap is greater than the first vertical gap.

In an embodiment of the disclosure, the first side has a first horizontal length, a second horizontal length is present between the maximum vertical length and the minimum vertical length, and a ratio of the second horizontal length to the first horizontal length is greater than 0.2.

In an embodiment of the disclosure, the first electrode further has a plurality of third sides, the third sides connect the first side and the second side, and the minimum vertical length is a vertical length of each of the third sides.

In an embodiment of the disclosure, the second side is bent and includes a straight part and a plurality of inclined parts. The inclined parts respectively connect the straight part and the third sides. Each of the inclined parts has a third horizontal length, and a ratio of the third horizontal length to the first horizontal length is greater than 0.2.

In an embodiment of the disclosure, the second side is curved and tangent to a reference tangent at a point. A connection line between the point and the adjacent third side, and the second side define an enclosed region. An extension line of the third side, the reference tangent, and the connection line form a virtual triangle, and an area of the enclosed region is smaller than an area of the virtual triangle.

In an embodiment of the disclosure, a ratio of the area of the enclosed region to the area of the virtual triangle is less than or equal to 0.6.

In an embodiment of the disclosure, a ratio of the first vertical gap to the second vertical gap is less than 0.8.

In an embodiment of the disclosure, a projection plane of the first electrode on a horizontal plane and a projection plane of the second electrode on the horizontal plane are symmetrical.

In an embodiment of the disclosure, the first electrode has a first orthographic projection area on a horizontal plane, and the second electrode has a second orthographic projection area on the horizontal plane. The first orthographic projection area is different from the second orthographic projection area.

In an embodiment of the disclosure, a ratio of the first orthographic projection area to the second orthographic projection area is greater than 0.2 and less than 5, but not equal to 1.

A micro light emitting device of the disclosure includes an epitaxial structure layer and an electrode structure. The epitaxial structure layer has a surface, and the electrode structure is disposed on the surface of the epitaxial structure layer. The electrode structure includes a first electrode and a second electrode disposed opposite to each other. The first electrode has a first side and a second side. The second side is located between the first side and the second electrode. The first electrode has a maximum vertical length and a minimum vertical length from the first side to the second side, and a ratio of the minimum vertical length to the maximum vertical length is less than 0.8. The second electrode and the first electrode are separated by a first vertical gap and a second vertical gap, and the second vertical gap is greater than the first vertical gap.

In an embodiment of the disclosure, the surface of the epitaxial structure layer has a length, and a ratio of the first vertical gap to the length is greater than 0.1.

In an embodiment of the disclosure, the first electrode has a first orthographic projection area on the surface, and the second electrode has a second orthographic projection area on the surface. The first orthographic projection area is different from the second orthographic projection area.

In an embodiment of the disclosure, the surface has an area, and a ratio of a sum of the first orthographic projection area and the second orthographic projection area to the area is less than 0.8 and greater than 0.2.

A display panel of the disclosure includes a circuit substrate, at least one electrode structure, and at least one micro light emitting device. The electrode structure is disposed on the circuit substrate and includes a first electrode and a second electrode disposed opposite to each other. The first electrode has a first side and a second side. The second side is located between the first side and the second electrode. The first electrode has a maximum vertical length and a minimum vertical length from the first side to the second side, and a ratio of the minimum vertical length to the maximum vertical length is less than 0.8. The second electrode and the first electrode are separated by a first vertical gap and a second vertical gap, and the second vertical gap is greater than the first vertical gap. The micro light emitting device is disposed on the circuit substrate and electrically connected to the electrode structure.

In an embodiment of the disclosure, the micro light emitting device includes: an epitaxial structure layer having a surface; and a light emitting device electrode structure disposed on the surface of the epitaxial structure layer and including a first light emitting device electrode and a second light emitting device electrode disposed opposite to each other. The micro light emitting device is electrically connected to the electrode structure via the light emitting device electrode structure. The second light emitting device electrode and the first light emitting device electrode are separated by a third vertical gap and a fourth vertical gap, and the fourth vertical gap is greater than the third vertical gap.

In an embodiment of the disclosure, the micro light emitting device includes: an epitaxial structure layer having a surface; and a light emitting device electrode structure disposed on the surface of the epitaxial structure layer and including a first light emitting device electrode and a second light emitting device electrode disposed opposite to each other. The micro light emitting device is electrically connected to the first electrode and the second electrode of the electrode structure via the first light emitting device electrode and the second light emitting device electrode respectively. An orthographic projection area of the first light emitting device electrode and the first electrode on the circuit substrate after the first light emitting device electrode and the first electrode are connected is different from an orthographic projection area of the second light emitting device electrode and the second electrode on the circuit substrate after the second light emitting device electrode and the second electrode are connected.

Based on the above, in the design of the electrode structure of the disclosure, the first electrode meets the condition that the ratio of the minimum vertical length to the maximum vertical length is less than 0.8, and the first electrode and the second electrode meet the condition that the second vertical gap is greater than the first vertical gap. With the above structural design, the electrode structure of the disclosure prevents a short circuit caused by misconnection, and because of the design of the electrode structure, the micro light emitting device using the electrode structure of the disclosure provides a buffering effect in the process of being bonded to the circuit substrate. As a result, the display panel using the electrode structure and the micro light emitting device of the disclosure has favorable reliability.

To make the aforementioned and other features and advantages of the disclosure more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1A:
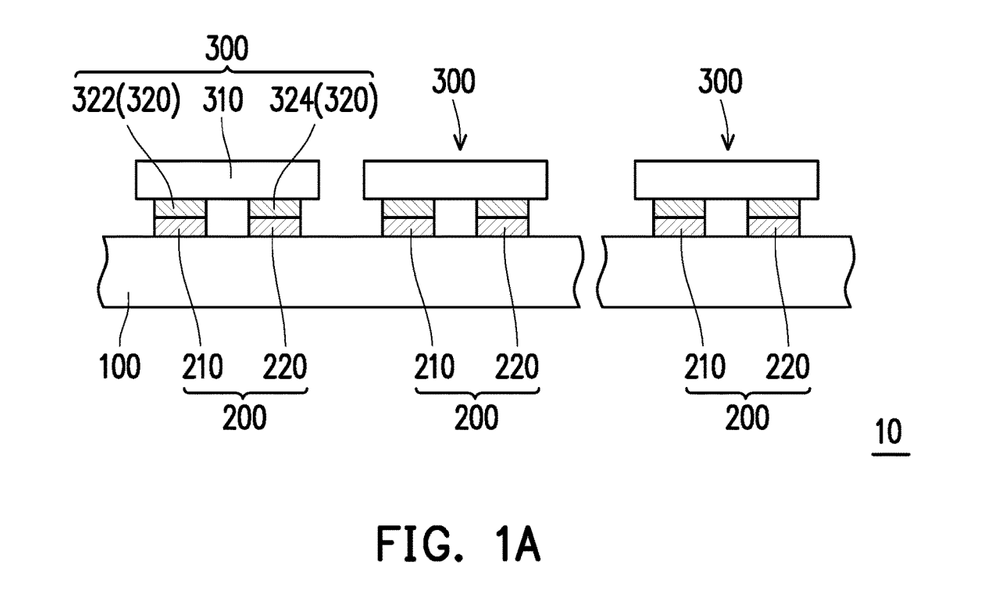
FIG. 1A is a cross-sectional view of a display panel according to an embodiment of the disclosure.
Figure 1B:
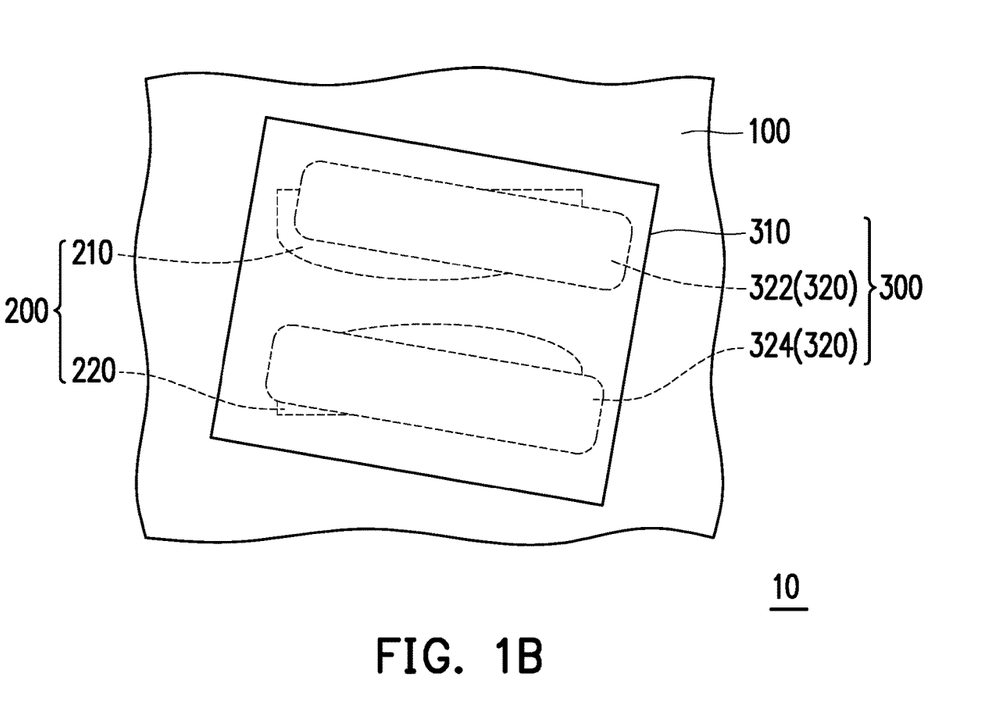
FIG. 1B is a partial top view of the display panel of FIG. 1A.
Figure 1C:
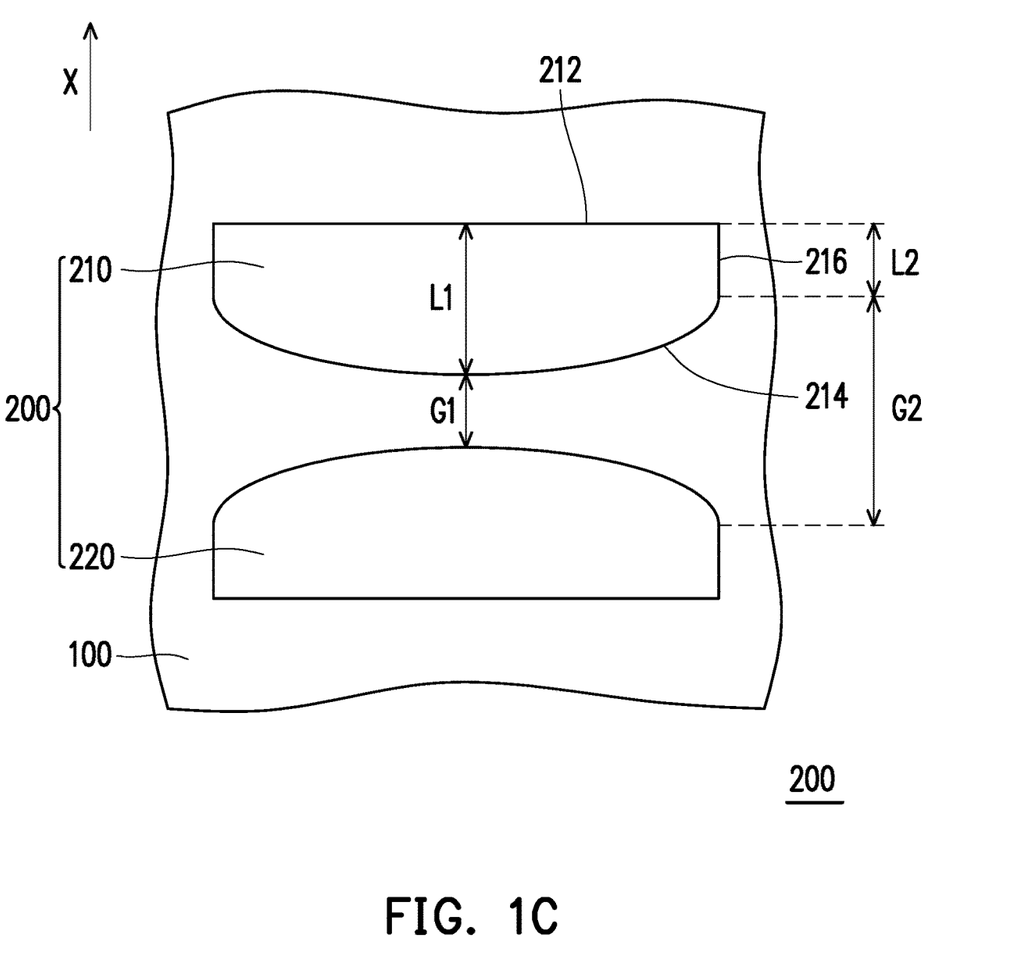
FIG. 1C is a top view of an electrode structure and a circuit substrate of FIG. 1A.

FIG. 1A is a cross-sectional view of a display panel according to an embodiment of the disclosure. FIG. 1B is a partial top view of the display panel of FIG. 1A. FIG. 1C is a top view of an electrode structure and a circuit substrate of FIG. 1A. First, referring to FIG. 1A and FIG. 1B, in the present embodiment, the display panel 10 includes a circuit substrate 100, at least one electrode structure (three electrode structures 200 are shown as an example), and at least one micro light emitting device 300 (three micro light emitting devices 300 are shown as an example). The electrode structure 200 and the micro light emitting device 300 are both disposed on the circuit substrate 100, and the electrode structure 200 is located between the micro light emitting device 300 and the circuit substrate 100. The micro light emitting device 300 and the electrode structure 200 are electrically connected to the circuit substrate 100. Here, the circuit substrate 100 is, for example, a complementary metal-oxide-semiconductor (CMOS) substrate, a liquid crystal on silicon (LCOS) substrate, a thin film transistor (TFT) substrate or other substrates having a working circuit. Nevertheless, the disclosure is not limited thereto.

Referring to FIG. 1C, the electrode structure 200 of the present embodiment includes a first electrode 210 and a second electrode 220 disposed opposite to each other. In the top view, the first electrode 210 has a first side 212, a second side 214, and a plurality of third sides 216. The second side 214 is located between the first side 212 and the second electrode 220, and the third sides 216 connect the first side 212 and the second side 214. Here, the first side 212 and the third sides 216 are straight, and the second side 214 is curved.

In particular, in the direction X, the first electrode 210 has a maximum vertical length L1 and a minimum vertical length L2 from the first side 212 to the second side 214. The minimum vertical length L2 is less than the maximum vertical length L1. Preferably, the minimum vertical length L2 is the vertical length of the third side 216, and a ratio of the minimum vertical length L2 to the maximum vertical length L1 is less than 0.8. That is to say, the shape of the first electrode 210 is not rectangular, but is wide in the middle and gradually becomes narrower toward the periphery. A ratio greater than or equal to 0.8 may cause the width at the periphery to be insufficient and affect the yield of the subsequent bonding process.

Referring again to FIG. 1C, the second electrode 220 and the first electrode 210 have a shortest vertical distance therebetween, which is a first vertical gap G1. Each of the third sides 216 of the first electrode 210 and the second electrode 220 have a shortest vertical distance therebetween, which is a second vertical gap G2. The second vertical gap G2 is greater than the first vertical gap G1. Preferably, a ratio of the first vertical gap G1 to the second vertical gap G2 is less than 0.8. That is to say, the gap between the first electrode 210 and the second electrode 220 is narrow in the middle and gradually becomes wider toward the periphery. A ratio greater than or equal to 0.8 may cause the width at the periphery to be insufficient and affect the yield of the subsequent bonding process.

As shown in FIG. 1C, the contour of the first electrode 210 and the contour of the second electrode 220 of the present embodiment are substantially symmetrical. That is to say, the structural form of the second electrode 220 and the structural form of the first electrode 210 are identical, and an edge of the first electrode 210 is aligned with an edge of the second electrode 220. The above facilitates the manufacturing of the electrodes and provides a larger buffering space in the bonding process. Here, a projection plane of the first electrode 210 on the circuit substrate 100 and a projection plane of the second electrode 220 on the circuit substrate 100 are symmetrical.

Referring again to FIG. 1B, when the micro light emitting device 300 is bonded to the electrode structure 200 on the circuit substrate 100, a first electrode 322 (that is, a first light emitting device electrode of a light emitting device electrode structure) and a second electrode 324 (that is, a second light emitting device electrode of the light emitting device electrode structure) located on the same side of an epitaxial structure layer 310 respectively correspond to the first electrode 210 and the second electrode 220 of the electrode structure 200. As described above, the first electrode 210 meets the condition that the ratio of the minimum vertical length L2 to the maximum vertical length L1 is less than 0.8, and the first electrode 210 and the second electrode 220 meet the condition that the second vertical gap G2 is greater than the first vertical gap G1. With the above structural design, the electrode structure 200 of the present embodiment prevents a short circuit caused by misconnection and provides a buffering effect during the bonding process. As a result, the display panel 10 using the electrode structure 200 of the present embodiment has favorable reliability.

It is to be noted that some of the reference numerals and parts of the above-described embodiments are also used in the following embodiments, wherein the same reference numerals denote the same or similar elements, and the descriptions thereof are omitted to avoid repetition. Please refer to the above embodiments for descriptions of the omitted parts.

Figure 2A:
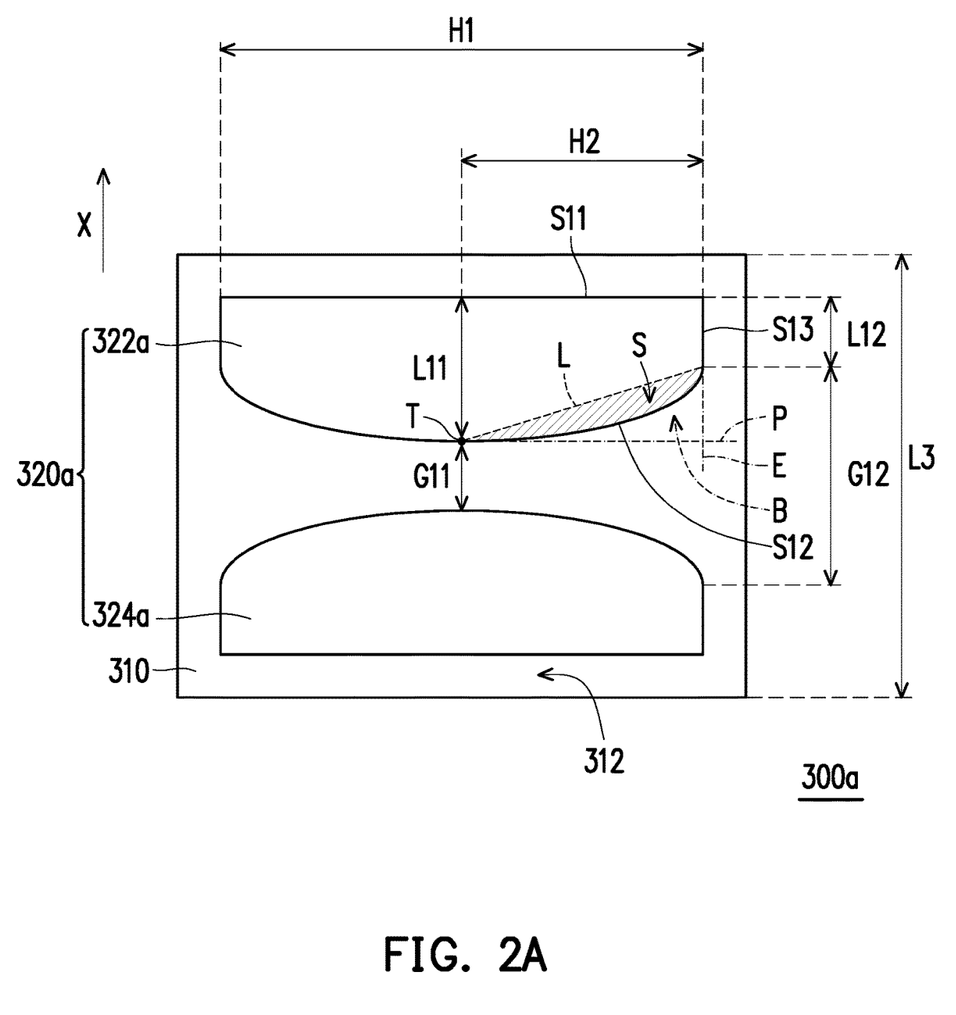
FIG. 2A is a top view of a micro light emitting device according to an embodiment of the disclosure.

FIG. 2A is a top view of a micro light emitting device according to an embodiment of the disclosure. Referring to FIG. 1B and FIG. 2A, the micro light emitting device 300a of the present embodiment is similar to the micro light emitting device 300 of FIG. 1B, and the difference therebetween is: the shapes of the first electrode 322 and the second electrode 324 of the micro light emitting device 300 of FIG. 1B are rectangles with rounded corners. Otherwise, the electrode structure 320a of the micro light emitting device 300a of the present embodiment has the same structural design as the electrode structure 200 disposed on the circuit substrate 100 described above.

Specifically, the micro light emitting device 300a includes the epitaxial structure layer 310 and the electrode structure 320a. The epitaxial structure layer 310 has a surface 312, and the electrode structure 320a is disposed on the surface 312 of the epitaxial structure layer 310, wherein the surface 312 has a length L3 in the direction X. The electrode structure 320a includes a first electrode 322a and a second electrode 324a disposed opposite to each other. In the top view, the first electrode 322a has a first side S11, a second side S12, and a plurality of third sides S13. The second side S12 is located between the first side S11 and the second electrode 324a, and the third sides S13 connect the first side S11 and the second side S12. Here, the first side S11 and the third sides S13 are straight, and the second side S12 is curved.

In particular, in the direction X, the first electrode 322a has a maximum vertical length L11 and a minimum vertical length L12 from the first side S11 to the second side S12. The minimum vertical length L12 is less than the maximum vertical length L11. Preferably, the minimum vertical length L12 is the vertical length of the third side S13, and a ratio of the minimum vertical length L12 to the maximum vertical length L11 is less than 0.8. That is to say, the shape of the first electrode 322a is not rectangular, but is wide in the middle and gradually becomes narrower toward the periphery. A ratio greater than or equal to 0.8 may cause the width at the periphery to be insufficient and affect the yield of the subsequent bonding process.

Furthermore, the second electrode 324a and the first electrode 322a have a shortest vertical distance therebetween, which is a first vertical gap G11 (may be regarded as a third vertical gap). Each of the third sides S13 of the first electrode 322a and the second electrode 324a have a shortest vertical distance therebetween, which is a second vertical gap G12 (may be regarded as a fourth vertical gap). The second vertical gap G12 is greater than the first vertical gap G11. Preferably, a ratio of the first vertical gap G11 to the second vertical gap G12 is less than 0.8. That is to say, the gap between the first electrode 322a and the second electrode 324a is narrow in the middle and gradually becomes wider toward the periphery. Further, a ratio of the first vertical gap G11 to the length L3 of the surface 312 is greater than 0.1, so as to prevent the reliability from decreasing due to an overly small gap between the first electrode 322a and the second electrode 324a.

Referring again to FIG. 2A, the first side S11 of the first electrode 322a of the present embodiment has a first horizontal length H1. A minimum horizontal distance is present between the maximum vertical length L11 and the minimum vertical length L12, and this distance is a second horizontal length H2. A ratio of the second horizontal length H2 to the first horizontal length H1 is greater than 0.2. Furthermore, the second side S12 is tangent to a reference tangent P at a point T, and a connection line L between the point T and the adjacent third side S13, and the second side S12 define an enclosed region S. An extension line E of the third side S13, the reference tangent P, and the connection line L form a virtual triangle B. In particular, the area of the enclosed region S is smaller than the area of the virtual triangle B, and a ratio of the area of the enclosed region S to the area of the virtual triangle B is less than or equal to 0.6. A ratio greater than 0.6 may cause the surrounding buffering space to be small enough and affect the yield of the subsequent bonding process.

In addition, as shown in FIG. 2A, the contour of the first electrode 322a and the contour of the second electrode 324a are symmetrical. That is to say, the structural form of the second electrode 324a and the structural form of the first electrode 322a are identical, and an edge of the first electrode 322a is aligned with an edge of the second electrode 324a. Here, a projection plane of the first electrode 322a on the surface 312 and a projection plane of the second electrode 324a on the surface 312 are symmetrical.

Figure 2B:
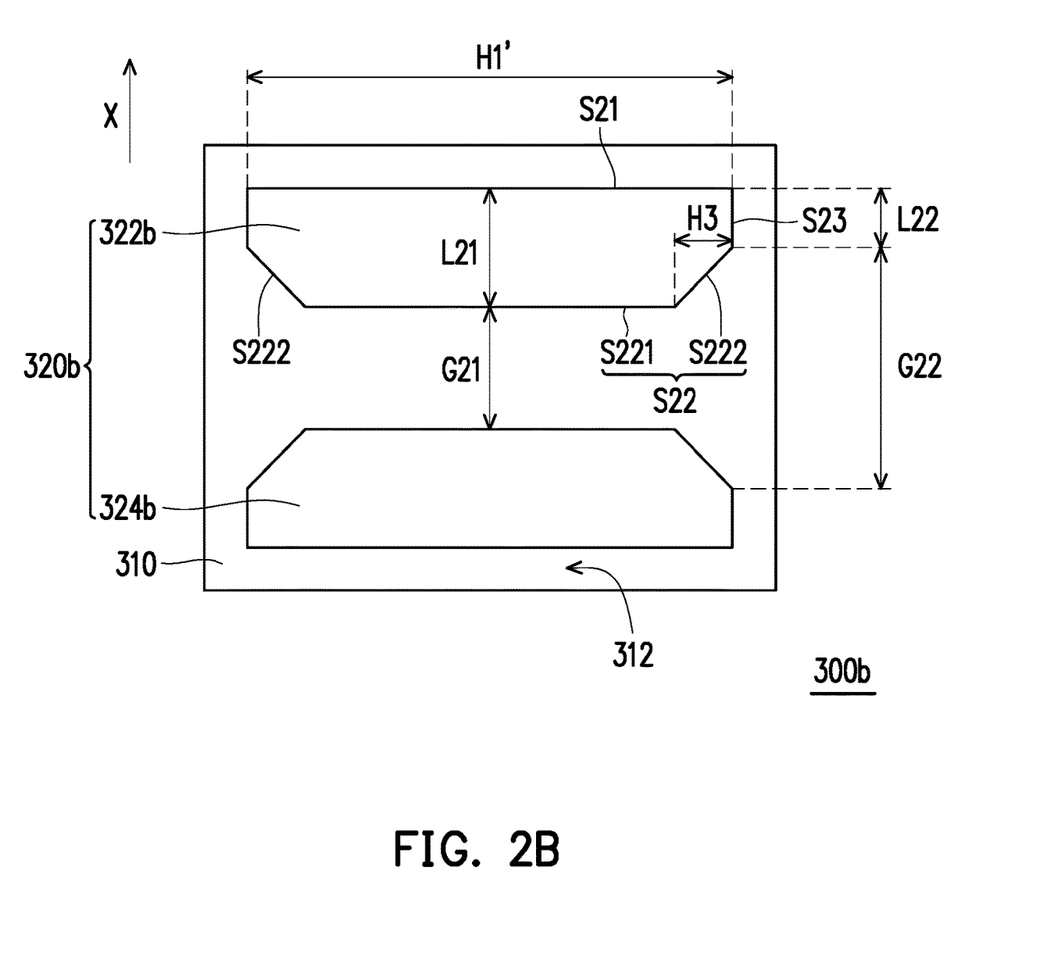
FIG. 2B is a top view of a micro light emitting device according to another embodiment of the disclosure.

FIG. 2B is a top view of a micro light emitting device according to another embodiment of the disclosure. Referring to FIG. 2A and FIG. 2B, the micro light emitting device 300b of the present embodiment is similar to the micro light emitting device 300a of FIG. 2A, and the difference therebetween is: the shapes of the first electrode 322b and the second electrode 324b of the electrode structure 320b of the present embodiment are different from the shapes of the first electrode 322a and the second electrode 324a of the electrode structure 320a. The shapes of the first electrode 322b and the second electrode 324b have bevels.

Specifically, the first side S21 of the first electrode 322b is straight, and the second side S22 is bent and includes a straight part S221 and two inclined parts S222. The inclined part S222 connects the straight part S221 and the third side S23. The first side S21 of the first electrode 322b has a first horizontal length H1', and each of the inclined parts S222 has a third horizontal length H3. A ratio of the third horizontal length H3 to the first horizontal length H1' is greater than 0.2. The above facilitates the manufacturing of the electrodes and provides a larger buffering space in the bonding process.

Like the design of FIG. 2A, the first electrode 322b of the present embodiment has a maximum vertical length L21 from the first side S21 to the second side S22, and each of the third sides S23 has a minimum vertical length L22. A ratio of the minimum vertical length L22 to the maximum vertical length L21 is less than 0.8. The second electrode 324b and the first electrode 322b have a first vertical gap G21 therebetween, and each of the third sides S23 of the first electrode 322b and the second electrode 324b have a second vertical gap G22 therebetween. The second vertical gap G22 is greater than the first vertical gap G21. Here, a projection plane of the first electrode 322b on a horizontal plane (such as the surface 312) and a projection plane of the second electrode 324b on the horizontal plane are symmetrical. That is to say, the structural form of the second electrode 324b and the structural form of the first electrode 322b are identical, and an edge of the first electrode 322b is aligned with an edge of the second electrode 324b.

Figure 2C:
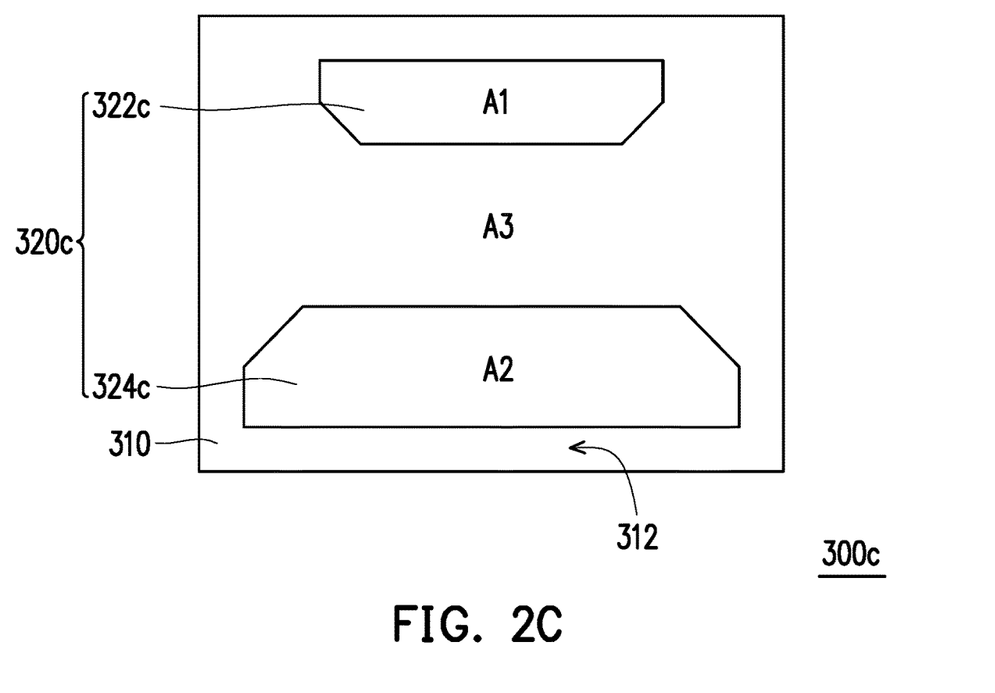
FIG. 2C is a top view of a micro light emitting device according to yet another embodiment of the disclosure.

FIG. 2C is a top view of a micro light emitting device according to yet another embodiment of the disclosure. Referring to FIG. 2B and FIG. 2C, the micro light emitting device 300c of the present embodiment is similar to the micro light emitting device 300b of FIG. 2B, and the difference therebetween is: the first electrode 322c and the second electrode 324c of the electrode structure 320c of the present embodiment have different sizes. Specifically, the first electrode 322c has a first orthographic projection area A1 on the surface 312, and the second electrode 324c has a second orthographic projection area A2 on the surface 312. The first orthographic projection area A1 is different from the second orthographic projection area A2. Here, the first orthographic projection area A1 is smaller than the second orthographic projection area A1. However, the disclosure is not limited thereto. In other embodiments, the first orthographic projection area A1 may be larger than the second orthographic projection area A2. A ratio of the first orthographic projection area A1 to the second orthographic projection area A2 is greater than 0.2 and less than 5, but not equal to 1. Further, the surface 312 has an area A3, and a ratio of a sum of the first orthographic projection area A1 and the second orthographic projection area A2 to the area A3 is less than 0.8 and greater than 0.2. An overly large ratio may cause a reduction in the buffering space, but an overly small ratio may cause a decrease in the process yield.

Figure 2D:
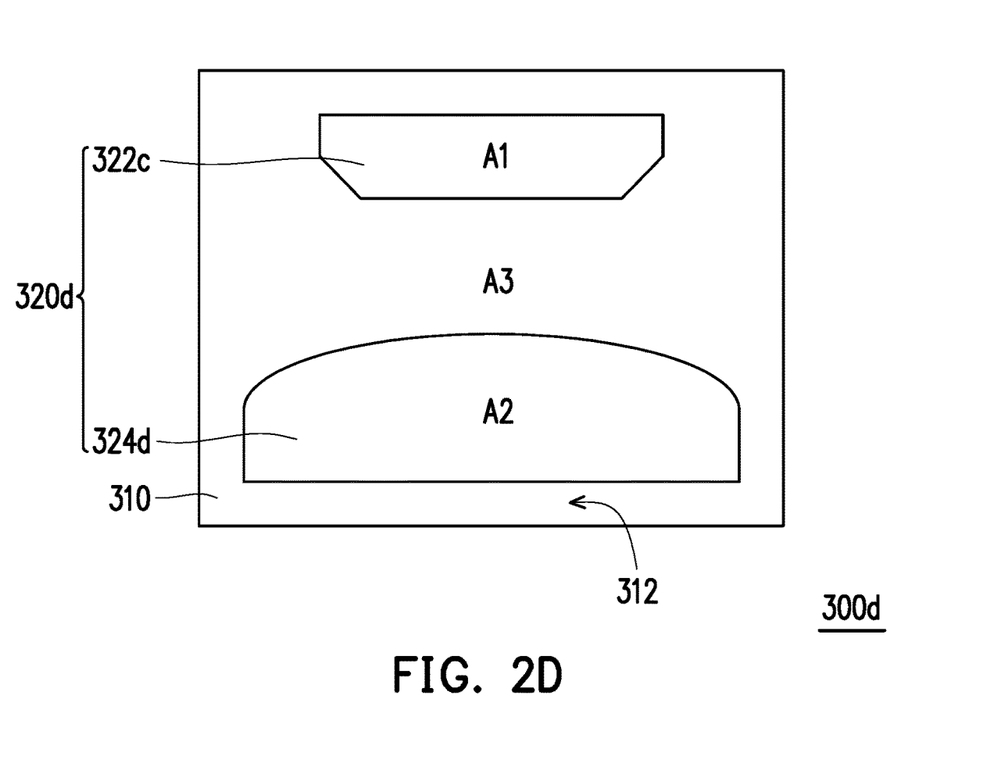
FIG. 2D is a top view of a micro light emitting device according to yet another embodiment of the disclosure.

FIG. 2D is a top view of a micro light emitting device according to yet another embodiment of the disclosure. Referring to FIG. 2C and FIG. 2D, the micro light emitting device 300d of the present embodiment is similar to the micro light emitting device 300c of FIG. 2C, and the difference therebetween is: the shape of the first electrode 322c of the electrode structure 320d of the present embodiment is different from the shape of the second electrode 324d. Here, the shape of the second electrode 324d is the same as the shape of the second electrode 324a of FIG. 2A, both of which have an arc edge.

It is worth mentioning that, in other embodiments not shown, the electrode structures 320a, 320b, 320c, and 320d shown in FIG. 2A, FIG. 2B, FIG. 2C, and FIG. 2D may also serve as the above-described electrode structure on the circuit substrate, which still falls within the scope of the disclosure.

To conclude the above, in the design of the electrode structure of the disclosure, the first electrode meets the condition that the ratio of the minimum vertical length to the maximum vertical length is less than 0.8, and the first electrode and the second electrode meet the condition that the second vertical gap is greater than the first vertical gap. With the above structural design, the electrode structure of the disclosure prevents a short circuit caused by misconnection, and because of the design of the electrode structure, the micro light emitting device using the electrode structure of the disclosure provides a buffering effect in the process of being bonded to the circuit substrate. As a result, the display panel using the electrode structure and the micro light emitting device of the disclosure has favorable reliability.

Although the disclosure has been described with reference to the above embodiments, they are not intended to limit the disclosure. It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. An electrode structure, comprising:
   a first electrode; and
   a second electrode disposed opposite to the first electrode, wherein the first electrode has a first side and a second side, the second side is located between the first side and the second electrode, the first electrode has a maximum vertical length and a minimum vertical length from the first side to the second side, and a ratio of the minimum vertical length to the maximum vertical length is less than 0.8, and
   the second electrode and the first electrode are separated by a first vertical gap and a second vertical gap, and the second vertical gap is greater than the first vertical gap, wherein a ratio of the first vertical gap to the second vertical gap is less than 0.8.

2. The electrode structure according to claim 1, wherein the first side has a first horizontal length,
   a second horizontal length is present between the maximum vertical length and the minimum vertical length, and
   a ratio of the second horizontal length to the first horizontal length is greater than 0.2.

3. The electrode structure according to claim 2, wherein the first electrode further has a plurality of third sides, the third sides connect the first side and the second side, and the minimum vertical length is a vertical length of each of the third sides.

4. The electrode structure according to claim 3, wherein the second side is bent and comprises a straight part and a plurality of inclined parts, the inclined parts respectively connect the straight part and the third sides, each of the inclined parts has a third horizontal length, and a ratio of the third horizontal length to the first horizontal length is greater than 0.2.

5. The electrode structure according to claim 3, wherein the second side is curved and tangent to a reference tangent at a point, a connection line between the point and the adjacent third side, and the second side define an enclosed region, an extension line of the third side, the reference tangent, and the connection line form a virtual triangle, and an area of the enclosed region is smaller than an area of the virtual triangle.

6. The electrode structure according to claim 5, wherein a ratio of the area of the enclosed region to the area of the virtual triangle is less than or equal to 0.6.

7. The electrode structure according to claim 1, wherein a projection plane of the first electrode on a horizontal plane and a projection plane of the second electrode on the horizontal plane are symmetrical.

8. The electrode structure according to claim 1, wherein the first electrode has a first orthographic projection area on a horizontal plane, the second electrode has a second orthographic projection area on the horizontal plane, and the first orthographic projection area is different from the second orthographic projection area.

9. The electrode structure according to claim 8, wherein a ratio of the first orthographic projection area to the second orthographic projection area is greater than 0.2 and less than 5, but not equal to 1.

10. A micro light emitting device, comprising:

an epitaxial structure layer having a surface; and an electrode structure disposed on the surface of the epitaxial structure layer and comprising a first electrode and a second electrode disposed opposite to each other, wherein the first electrode has a first side and a second side, the second side is located between the first side and the second electrode, the first electrode has a maximum vertical length and a minimum vertical length from the first side to the second side, and a ratio of the minimum vertical length to the maximum vertical length is less than 0.8, and the second electrode and the first electrode are separated by a first vertical gap and a second vertical gap, and the second vertical gap is greater than the first vertical gap, wherein the surface of the epitaxial structure layer has a length, and a ratio of the first vertical gap to the length is greater than 0.1.

11. The micro light emitting device according to claim 10, wherein the first electrode has a first orthographic projection area on the surface, the second electrode has a second orthographic projection area on the surface, and the first orthographic projection area is different from the second orthographic projection area.

12. The micro light emitting device according to claim 11, wherein the surface has an area, and a ratio of a sum of the first orthographic projection area and the second orthographic projection area to the area is less than 0.8 and greater than 0.2.

13. A display panel, comprising:

a circuit substrate;

at least one electrode structure disposed on the circuit substrate and comprising a first electrode and a second electrode disposed opposite to each other, wherein the first electrode has a first side and a second side, the second side is located between the first side and the second electrode, the first electrode has a maximum vertical length and a minimum vertical length from the first side to the second side, and a ratio of the minimum vertical length to the maximum vertical length is less than 0.8, and the second electrode and the first electrode are separated by a first vertical gap and a second vertical gap, and the second vertical gap is greater than the first vertical gap; and at least one micro light emitting device disposed on the circuit substrate and electrically connected to the electrode structure, wherein the at least one micro light emitting device comprises:

an epitaxial structure layer having a surface; and a light emitting device electrode structure disposed on the surface of the epitaxial structure layer and comprising a first light emitting device electrode and a second light emitting device electrode disposed opposite to each other, wherein the at least one micro light emitting device is electrically connected to the electrode structure via the light emitting device electrode structure, and the second light emitting device electrode and the first light emitting device electrode are separated by a third vertical gap and a fourth vertical gap, and the fourth vertical gap is greater than the third vertical gap.

14. The display panel according to claim 13, wherein the at least one micro light emitting device is electrically connected to the first electrode and the second electrode of the electrode structure via the first light emitting device electrode and the second light emitting device electrode respectively, and an orthographic projection area of the first light emitting device electrode and the first electrode on the circuit substrate after the first light emitting device electrode and the first electrode are connected is different from an orthographic projection area of the second light emitting device electrode and the second electrode on the circuit substrate after the second light emitting device electrode and the second electrode are connected.

* * * * *